United States Patent
Lin

(10) Patent No.: US 9,046,550 B2
(45) Date of Patent: Jun. 2, 2015

(54) SIGNAL TRANSMISSION LINES WITH TEST PAD

(71) Applicant: HON HAI PRECISION INDUSTRY CO., LTD., New Taipei (TW)

(72) Inventor: Yu-Hsu Lin, Santa Clara, CA (US)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 141 days.

(21) Appl. No.: 13/711,415

(22) Filed: Dec. 11, 2012

(65) Prior Publication Data

US 2013/0154680 A1  Jun. 20, 2013

(30) Foreign Application Priority Data

Dec. 20, 2011  (CN) .......................... 2011 1 0429414

(51) Int. Cl.
  *G01R 31/20* (2006.01)
  *G01R 1/067* (2006.01)
  *H04B 3/46* (2006.01)

(52) U.S. Cl.
  CPC . *G01R 1/067* (2013.01); *H04B 3/46* (2013.01)

(58) Field of Classification Search
  CPC ...... G01R 1/067; G01R 31/2818; H04B 3/46; H01P 3/081; H05K 1/0245; H05K 1/0268; H05K 2201/09236; H05K 2201/09636; H03H 7/345
  USPC .................... 324/754.01, 754.03, 314; 333/4; 174/261, 255, 262, 264
  See application file for complete search history.

(56) References Cited

U.S. PATENT DOCUMENTS

| 5,961,355 | A  | * | 10/1999 | Morlion et al. ............... 439/686 |
| 8,586,873 | B2 |   | 11/2013 | Wu |
| 2006/0284697 | A1 | * | 12/2006 | Lin et al. .......................... 333/4 |

FOREIGN PATENT DOCUMENTS

| CN | 102196662 A | 9/2011 |
| TW | 521148 | 2/2003 |

* cited by examiner

*Primary Examiner* — Tung X Nguyen
*Assistant Examiner* — Son Le
(74) *Attorney, Agent, or Firm* — Novak Druce Connolly Bove + Quigg LLP

(57) ABSTRACT

A pair of signal transmission lines includes an aggressor line, a victim line, a first test pad, and a second test pad. The first test pad is in the aggressor line. The victim line is parallel to the aggressor line. A second test pad is in the victim line. The first test pad, on the aggressor line, is misaligned with the second test pad, on the victim line, to reduce the incidence and amplitude of any crosstalk generated.

11 Claims, 6 Drawing Sheets

SIGNAL TRANSMISSION LINES WITH TEST PAD

BACKGROUND

1. Technical Field

The present disclosure relates to techniques of transmitting electrical signals, and more particularly to signal transmission lines that reduce crosstalk.

2. Description of Related Art

After signal transmission lines are laid on the printed circuit board, the signal transmission lines need to be tested by putting test pads on the signal transmission lines. However, the test pads often generate a large amount of crosstalk on the signal transmission lines, which can cause system failure due to false signals appearing on a receiver.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
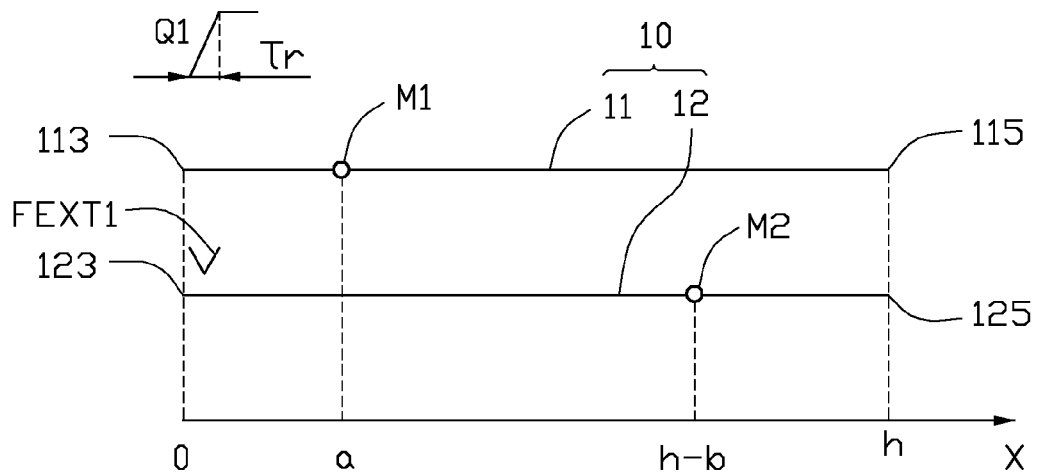
FIG. 1 is a sketch view of an embodiment of signal transmission lines with test pads.

Referring to FIG. 1, a pair of a first embodiment of signal transmission lines 10 with test pads includes an aggressor line 11 and a victim line 12. A mutual inductance between the two transmission lines is $L_m$. An inductance of each transmission line is L. A mutual capacitance between the two transmission lines is $C_m$. A capacitance of each transmission line is C. A rise time of a signal transmitted on the aggressor line 11 is $\tau_r$. A transmitting time of a signal transmitted on the aggressor line 11 is $T_{pd}$. The formula used to estimate crosstalk FEXT is: $FEXT[\%] = -T_{pd}/2\tau_r \times (L_m/L - C_m/C)$. From the formula, the amount of crosstalk FEXT becomes larger when the transmitting time $T_{pd}$ increases. In other words, the longer the length of the signal transmission line, the larger or more extensive the amount of crosstalk FEXT.

Length of each of the aggressor line 11 and the victim line 12 is h. The aggressor line 11 includes a first aggressor line end 113 and a second aggressor line end 115. The victim line 12 includes a first victim line end 123 in alignment with the first aggressor line end 113 of the aggressor line 11, and a second victim line end 125 in alignment with the second aggressor line end 115 of the aggressor line 11. The aggressor line 11 is parallel to a one dimension coordinate axis X with the first aggressor line end 113 in alignment with a zero point of the coordinate axis X. A coordinate value of the second aggressor line end 115 is h. A coordinate value of the first victim line end 123 is zero, and a coordinate value of the second victim line end 125 is h.

Two non-negative values a and b are chosen, to satisfy the following equation: a+b=h/2. A first position, whose coordinate value is a, of the aggressor line 11 is linked with a first test pad M1. A second position, whose coordinate value is h−b, of the victim line 12 is linked with a second test pad M2. Therefore, the first test pad M1 and the second test pad M2 have different coordinate values. In other words, the first test pad M1 is not in alignment with the second test pad M2, the two test pads are misaligned. In one embodiment, the first test pad M1 and the second test pad M2 are same type of test pad. The first test pad M1 and the second test pad M2 have time delay characters. When a signal is transmitted to the first test pad M1 on the aggressor line 11, the signal would delayed by the first test pad M1 in a delay time $T_d$. When a signal is transmitted to the second test pad M2 on the victim line 12, the signal would delayed by the second test pad M2 in the delay time $T_d$. The delay time $T_d$ is smaller than the rise time $T_r$.

Figure 2:
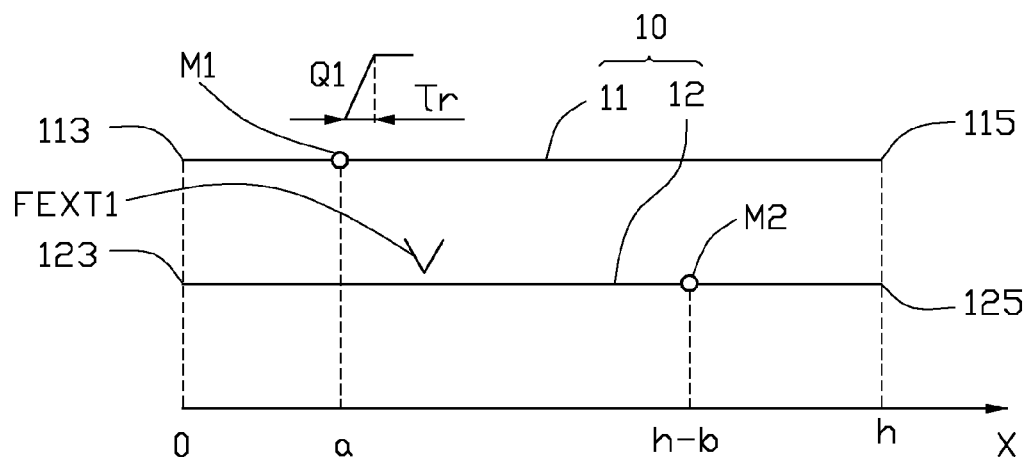
FIG. 2 is a first sketch view of a particular case of the signal transmission lines of FIG. 1.

Referring to FIGS. 1 and 2, when a signal Q1 starts to be transmitted on the aggressor line 11 from the first aggressor line end 113 of the aggressor line 11, a first crosstalk signal FEXT1 is generated on the first victim line end 123 of the victim line 12. The signal Q1 and the first crosstalk signal FEXT1 are synchronously transmitted forward along a path of transmission. The first crosstalk signal FEXT1 becomes larger under the influence of the signal Q1 as the signal Q1 and the first crosstalk signal FEXT1 progress along the path. When the signal Q1 and the first crosstalk signal FEXT1 reach a position of coordinate value a, the signal Q1 is delayed by the first test pad M1, and the first crosstalk signal FEXT1 continues along the path. Thus, there is asynchronous transmission of the signal Q1 and the first crosstalk signal FEXT1. The signal Q1 no longer influences the first crosstalk signal FEXT1, and the amplitude of the first crosstalk signal FEXT1 does not continue to increase as it progresses along the path.

Figure 3:
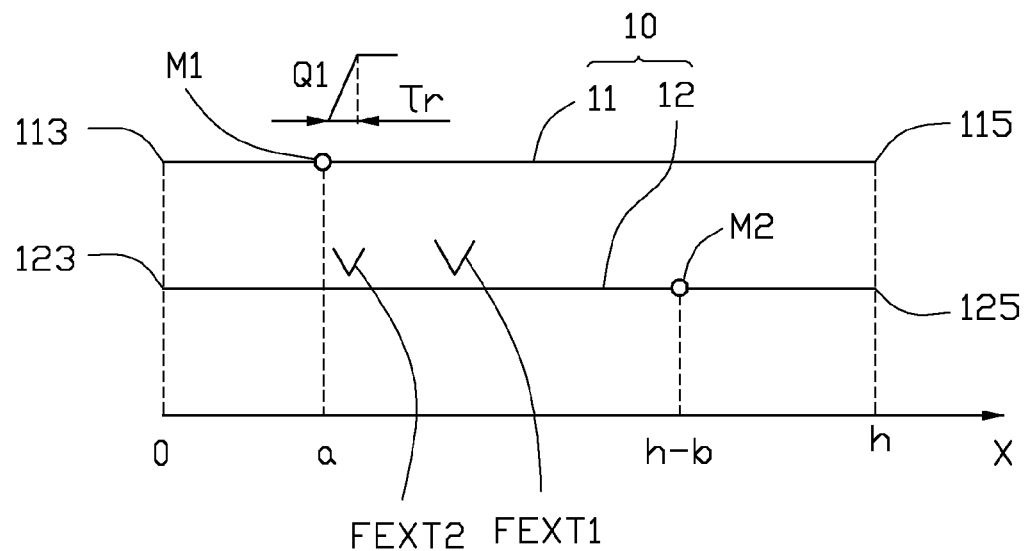
FIG. 3 is a second sketch view of a particular case of the signal transmission lines of FIG. 1.

Referring to FIG. 3, after the signal Q1 has been delayed by the first test pad M1 for the delay time $T_d$, the signal Q1 continues along the path and generates a second crosstalk signal FEXT2 on the victim line 12. The signal Q1 and the second crosstalk signal FEXT2 are synchronously transmitted from that point forward along the path of transmission. The second crosstalk signal FEXT2 becomes larger under the influence of the signal Q1 as the signal Q1 and the second crosstalk signal FEXT2 progress along the path.

Figure 4:
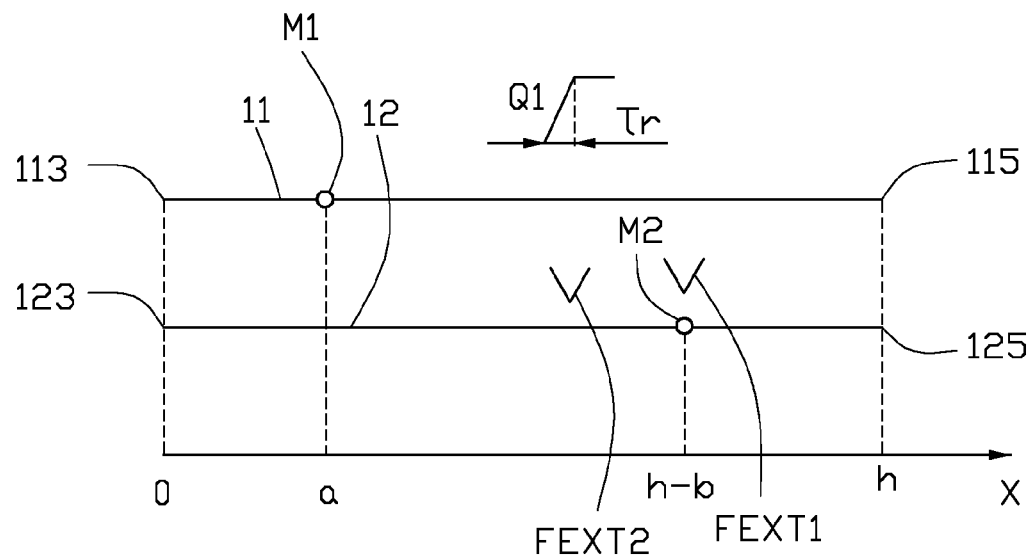
FIG. 4 is a third sketch view of a particular case of the signal transmission lines of FIG. 1.

Referring to FIG. 4, when the first crosstalk signal FEXT1 reaches coordinates h−b, the first crosstalk signal FEXT1 is delayed by the second test pad M2 for the delay time $T_d$.

Figure 5:
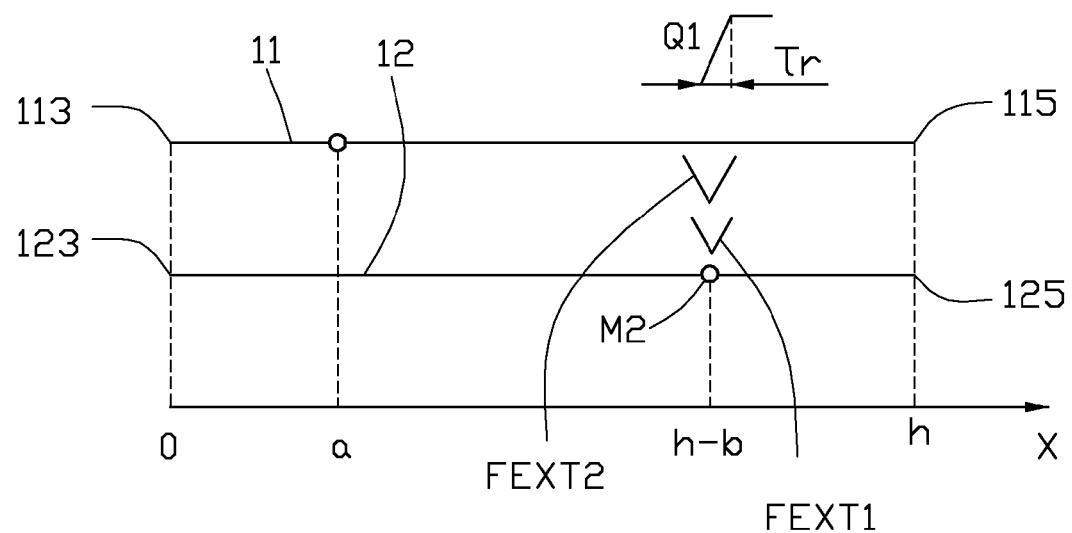
FIG. 5 is a fourth sketch view of a particular case of the signal transmission lines of FIG. 1.
Figure 6:
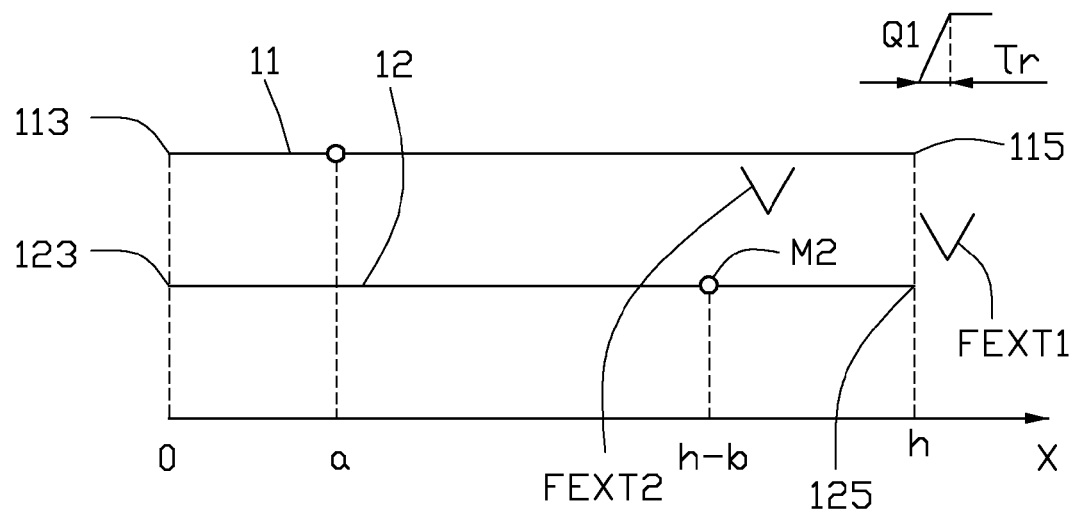
FIG. 6 is a fifth sketch view of a particular case of the signal transmission lines of FIG. 1.

Referring to FIGS. 5 and 6, after the first crosstalk signal FEXT1 is delayed for the delay time $T_d$, the signal Q1 and the second crosstalk signal FEXT2 reach coordinates position h-b. The second crosstalk signal FEXT2 is delayed by the second test pad M2. The signal Q1 and the first crosstalk signal FEXT1 then synchronously continue along the path. The first crosstalk signal FEXT1 again becomes larger under the influence of the signal Q1 as the signal Q1 and the first crosstalk signal FEXT1 progress along the path. The signal Q1 and the first crosstalk signal FEXT1 are transmitted to the second aggressor line end 115 and the second victim line end 125 and are output from the second aggressor line end 115 and the second victim line end 125. After the delay time Td, the second crosstalk signal FEXT2 is also output from the second victim line end 125.

The value of the first crosstalk signal FEXT1 is: FEXT1 [%]=$-T_{(a+b)}/2\tau_r \times (L_m/L - C_m/C)$. In the above equation, $T_{(a+b)}$ is a time of the first crosstalk signal FEXT1, transmitted over a distance of a+b. The value of the second crosstalk signal FEXT2 is: FEXT2[%]=$-T_{(h-a-b)}/2\tau_r \times (L_m/L - C_m/C)$. In the above equation, $T_{(h-a-b)}$ is a time of the second crosstalk signal FEXT2, transmitted over a distance of h−a−b. Because (a+b) is equal to h/2, (h−a−b) is also equal to h/2. Therefore, the value of the first crosstalk signal FEXT1 is equal to the value of the second crosstalk signal FEXT2. Values of the first crosstalk signal FEXT1 and of the second crosstalk signal FEXT2 are decreased to one half of the levels of conventional crosstalk signals. The first crosstalk signal FEXT1 and the second crosstalk signal FEXT2 are not overlapped, and do not therefore reinforce each other, and the amplitude of the crosstalk signals are decreased.

In the above embodiment, for conveniently linking the first test pad M1 and the second test pad M2, the respective values of a and b can be equal to h/4.

It is to be understood, however, that even though numerous characteristics and advantages of the embodiments have been set forth in the foregoing description, together with details of the structure and functions of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A pair of signal transmission lines, comprising:
   an aggressor line;
   a first test pad linked in the aggressor line;
   a victim line parallel to the aggressor line; and
   a second test pad linked in the victim line;
   wherein the first test pad, on the aggressor line, is misaligned with the second test pad, on the victim line;
   wherein a length of each of the aggressor line and the victim line is h; the aggressor line comprises a first aggressor line end and a second aggressor line end; the victim line comprises a first victim line end in alignment with the first aggressor line end of the aggressor line, and a second victim line end in alignment with the second aggressor line end of the aggressor line; the aggressor line is placed parallel to a one dimension coordinate axis with the first aggressor line end in alignment with a zero point of the coordinate axis, and the first test pad and the second test pad have different coordinate values; two not-negative values, a and b, satisfy the following equation: a+b=h/2, a first test pad coordinate value is a, and a second test pad coordinate value pad is h−b.

2. The pair of signal transmission lines of claim 1, wherein each of the two not-negative values, a and b, is equal to h/4.

3. The pair of signal transmission lines of claim 1, wherein the first test pad and the second test pad have a same delay time.

4. The pair of signal transmission lines of claim 3, wherein delay times of the first test pad and the second test pad are smaller than a rise time of a signal transmitted on the aggressor line.

5. The pair of signal transmission lines of claim 1, wherein the first test pad and the second test pad are same type of test pads.

6. A pair of signal transmission lines, comprising:
   an aggressor line with a first test pad linked therein; and
   a victim line with a second test pad linked therein;
   wherein the first test pad and the second test pad have a same delay time, and the first test pad on the aggressor line is malpositioned with the second test pad on the victim line; a length of the aggressor line being equal to a length of the victim line, and a distance between the first test pad and the second test pad is equal to half of the length of the aggressor.

7. The pair of signal transmission lines of claim 6, wherein length of each of the aggressor line and the victim line is h, the aggressor line comprises a first aggressor line end and a second aggressor line end, the victim line comprises a first victim line end in alignment with the first aggressor line end of the aggressor line, and a second victim line end in alignment with the second aggressor line end of the aggressor line; the aggressor line is placed parallel to a one dimension coordinate axis with the first aggressor line end in alignment with a zero point of the coordinate axis, and the first test pad and the second test pad have different coordinate values.

8. The pair of signal transmission lines of claim 7, wherein two not-negative values, a and b, satisfy the following equation: a+b=h/2, a first test pad coordinate value is a, and a second test pad coordinate value is h−b.

9. The pair of signal transmission lines of claim 8, wherein each of the two not-negative values, a and b, is equal to h/4.

10. The pair of signal transmission lines of claim 6, wherein delay times of the first test pad and the second test pad are smaller than a rise time of a signal transmitted on the aggressor line.

11. The pair of signal transmission lines of claim 6, wherein the first test pad and the second test pad are same type of test pads.

\* \* \* \* \*